United States Patent [19]

Li et al.

[11] Patent Number: 5,624,856

[45] Date of Patent: Apr. 29, 1997

[54] METHOD FOR FORMING A LATERAL BIPOLAR TRANSISTOR

[75] Inventors: Xiao-Ming Li, Ottawa; Sorin P. Voinigescu, Kanata, both of Canada

[73] Assignee: Northern Telecom Limited, Montreal, Canada

[21] Appl. No.: 662,964

[22] Filed: Jun. 13, 1996

Related U.S. Application Data

[62] Division of Ser. No. 546,642, Oct. 23, 1995.

[51] Int. Cl.⁶ .................................................. H01L 21/265
[52] U.S. Cl. ........................ 438/339; 438/366; 438/204
[58] Field of Search ............................... 437/32, 31, 34, 437/162; 148/DIG. 124, 123

[56] References Cited

U.S. PATENT DOCUMENTS

| | | | |
|---|---|---|---|
| 4,546,536 | 10/1985 | Anantha et al. | 437/32 |
| 5,086,005 | 2/1992 | Hirakawa | 437/162 |
| 5,387,553 | 2/1995 | Moksvold et al. | 437/32 |
| 5,486,481 | 1/1996 | Sundaram | 437/32 |

FOREIGN PATENT DOCUMENTS 0526374  2/1993  European Pat. Off. ............ 437/32

*Primary Examiner*—Tuan H. Nguyen
*Attorney, Agent, or Firm*—Angela C. de Wilton

[57] ABSTRACT

A lateral bipolar transistor comprising a self-aligned polysilicon base contact, and polysilicon emitter and collector contacts is provided. The self-aligned base contact significantly reduces the base width and therefore the base resistance compared with conventional lateral bipolar transistors, thus improving $f_t$ and $f_{max}$. The polysilicon emitter and collector contacts improve the emitter efficiency and current gain, and allows for more flexible contact placement. The process is compatible with conventional double-poly bipolar processes.

2 Claims, 5 Drawing Sheets

METHOD FOR FORMING A LATERAL BIPOLAR TRANSISTOR

This is a division of patent application Ser. No. 08/546,642, filed on Oct. 23, 1995 by X-M. Li, et al for "Lateral Bipolar Transistor".

FIELD OF INVENTION

This invention relates to a lateral bipolar transistor and a method of making a lateral bipolar transistor for an integrated circuit.

BACKGROUND OF THE INVENTION

In fabrication of silicon semiconductor based high speed integrated circuits, the integration of both CMOS (complementary metal oxide semiconductor transistors) and bipolar transistors to provide Bipolar-CMOS (BiCMOS) VLSI integrated circuits is now well established for telecommunications applications requiring high speed, high drive, mixed voltage and analog-digital performance. However, there is considerable challenge in optimizing the performance of both CMOS and bipolar devices fabricated with progressively reduced dimensions. A manufacturable fabrication process for minimum geometry integrated circuits must be provided without inordinately increasing the process complexity, i.e. the number of mask levels and process steps.

Bipolar transistors having an emitter-base-collector structure in either a vertical or a lateral configuration are known. Key parameters that must be reduced to increase switching speed are base width, base transport time, base resistance and base-collector capacitance.

In combining shallow junction CMOS transistors with bipolar transistors for a sub-micron BiCMOS VLSI integrated circuit, a vertical bipolar transistor is commonly used. For example, a vertical PNP bipolar transistor comprises a buried collector formed in a P type region of the substrate, a heavily N doped base region is provided in the substrate surface and an heavily P doped emitter region overlies an active base region, forming an emitter-base junction. Base contacts are provided to the base region of the substrate surface adjacent the active base region. Contact to the buried collector is made through a heavily P doped region (i.e. a sinker) extending to the substrate surface. A vertical bipolar transistor with a shallow base width may be obtained in a process compatible with forming shallow junctions for CMOS transistors. For example, a bipolar transistor with a base width of ~0.2 μm may be achieved by low energy ion implantation, or by diffusion of impurities from an overlying heavily doped layer.

On the other hand, a conventional lateral bipolar transistor differs in structure considerably from a vertical bipolar transistor. A typical PNP lateral bipolar transistor comprises a substrate on which is formed a P doped epitaxial layer. Heavily P doped regions are defined in the epitaxial layer to form an emitter and a collector. The latter are defined by ion implantation of surface regions. The active base region is provided by the N doped layer disposed between the emitter and the collector, the base width being defined by the lateral spacing of the emitter and the collector. A buried base contact is provided by an underlying heavily N doped base electrode region. Thus, in a lateral bipolar transistor of this structure, the base width is constrained to be larger than or equal to the minimum photolithographic resolution used in defining the implantation area for the emitter and collector regions. As an example, in a BiCMOS integrated circuit formed by a 0.8 μm process, the base width of a lateral bipolar transistor would be ~4 times larger than the 0.2 μm base width typically obtained in a vertical bipolar transistor.

Furthermore, a conventional lateral bipolar transistor suffers poor efficiency because when the emitter-base junction is forward biased, carriers are launched in all directions from the emitter, not only towards the emitter, but also towards the substrate. In the layout of a conventional lateral transistor the collector is made to encircle the emitter to improve the collector efficiency.

Various schemes have been investigated to improve the performance of lateral bipolar transistors, for example, as discussed in U.S. Pat. No. 5,081,517 to Contiero et al., issued 14 Jan. 1992 entitled "Mixed Technology Integrated Circuit Comprising CMOS Structure and Efficient Lateral Bipolar Transistors With a High Early Voltage and Fabrication Thereof". In a large dimensional lateral bipolar transistor, i.e. in a low density integration, the collector and emitter extend relatively deeply into the well region and the emitter current is efficiently collected by the collector. However, if a lateral bipolar transistor is integrated with a shallow junction MOSFET, and has a correspondingly shallow collector region, the collector efficiency may be very poor. In the lateral bipolar transistor of Contiero et al., a collector "extension" region of the lateral bipolar transistor is provided. The latter extends relatively deeply into the well region compared with a CMOS junction region, to intercept the emitter current and gather it to the collector, and thus improve collector efficiency. An annular diffusion region provides a collector which encircles the emitter region and thus increases the collector efficiency, and further reduces the proportion of the emitter current which is lost to the substrate.

In another approach, it is known to form trench based lateral PNP bipolar transistors in which an emitter is provided by a sidewall of a trench to increase the injecting area and provide a more efficient cross-section for a high performance PNP. For example, a method of forming higher performance lateral PNP transistor with buried base contact is described in U.S. Pat. No. 5,198,376 issued 30 Mar. 93 to Divakaruni et al. However, provision of trenches adds to the number of processing steps, and the process may not as easily be integrated into a BiCMOS process including shallow junction CMOS transistors.

Another approach to improving performance of bipolar transistors is described in U.S. Pat. No. 5,422,502 to Kovacic et al. issued 6 Jun. 1995 entitled "Lateral bipolar transistors" Nevertheless the latter approach is based on a silicon/germanium heterostructure, which requires more complex manufacturing.

SUMMARY OF THE INVENTION

Thus the present invention seeks to provide a lateral bipolar transistor structure for an integrated circuit and method of making a lateral bipolar transistor structure which overcomes or reduces the above mentioned problems.

According to one aspect of the present invention there is provided a lateral bipolar transistor for an integrated circuit, comprising: a semiconductor layer of a first conductivity type formed on a substrate; heavily doped buried layers of first and second conductivity types formed therein and well regions formed thereon of a corresponding conductivity type; a device well region defined by a field isolation layer on a well region of the first conductivity type with a heavily doped emitter region and a collector region of the second conductivity type defined in spaced apart surface regions of the device well region, a heavily doped polysilicon layer defined thereon defining emitter and collector contact electrodes and a first base contact opening extending therebetween; part of said heavily doped buried layer of the first conductivity type forming a buried base electrode thereunder, a second polysilicon layer forming a self-aligned second base contact within the base contact opening between the collector and emitter contact electrodes, and isolated therefrom by dielectric sidewall spacers; and a contact to the heavily doped buried layer extending through the field isolation layer to part of said buried layer thereby forming a second base contact.

Thus, a self aligned lateral bipolar transistor is provided. In the transistor structure, the self-aligned polysilicon base contact 66 provided a much narrower base width than existing typical field oxide isolated lateral bipolar transistors, i.e. as typified by the example in FIG. 1. Also, the direct polysilicon base contact provides a much lower base resistance than known LPNP transistors.

The combination of reduced base resistance and base width improve the device performance, increasing $f_t$ and $f_{max}$. Furthermore, a polysilicon emitter contact improves emitter efficiency, thereby increasing the current gain. The polysilicon emitter and collector contacts improve the emitter efficiency and current gain, and allow for more flexible contact placement. In particular the structure provides high performance LPNP devices in a 0.5 μm self-aligned bipolar technology. The devices find particular applications in integrated circuits for advanced high speed telecommunications systems.

According to yet another aspect of the present invention there is provided a method of forming a lateral bipolar transistor comprising: providing an integrated circuit substrate having a first and second heavily doped buried layers of a first and second conductivity type defined therein, and well regions of a corresponding conductivity type formed thereon defining field isolation regions thereon having openings defining device well regions; forming thereon a first layer of heavily doped polysilicon of a second conductivity type; providing a dielectric isolation layer on the first polysilicon layer; patterning the first layer of polysilicon and overlying dielectric layer to define a base contact opening therein, and first and second portions of the polysilicon layer forming a collector contact electrode and an emitter contact electrode adjacent the base contact opening; providing dielectric sidewall spacers on sidewalls of the polysilicon layer within the base contact opening; providing a second heavily doped layer of polysilicon within the base contact opening thereby forming a first base contact electrode to the base region of the substrate; forming a second base contact to the buried layer underlying the emitter and collector regions, and annealing the structure to diffuse dopant from the emitter and collector electrodes thereby forming heavily emitter and collector regions in the substrate surface, the well region of the opposite conductivity extending therebetween forming the base region of a lateral bipolar transistor, with first and second base contact electrodes formed by the second polysilicon layer and the underlying part of the heavily doped buried layer respectively.

Thus a method of forming the self-aligned lateral bipolar transistor is provided which is straigthforward, and compatible with known process technologies for fabrication of conventional double polysilicon vertical bipolar transistors.

BRIEF DESCRIPTION THE DRAWINGS

Embodiments of the invention will now be described by way of example, with reference to the accompanying drawings, in which.

DESCRIPTION OF THE PREFERRED EMBODIMENTS

Figure 1:
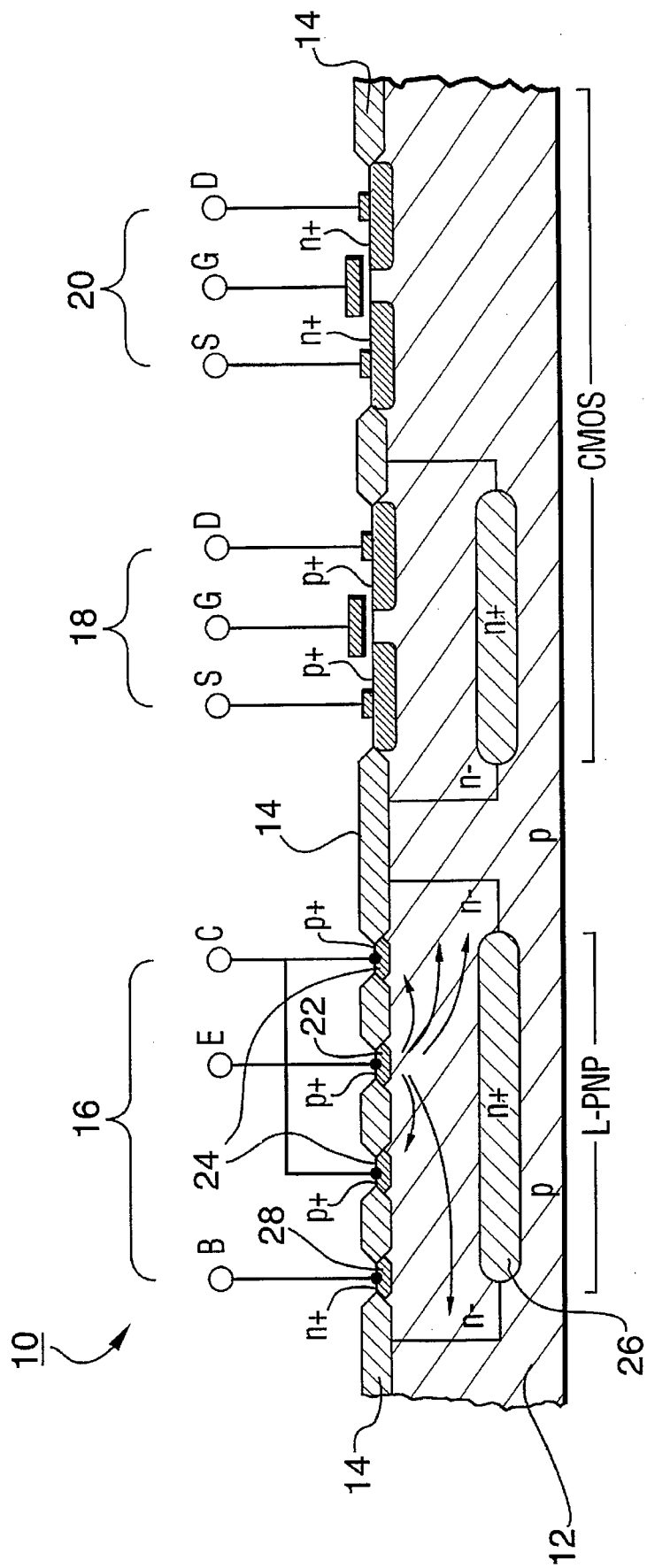
FIG. 1 shows a cross sectional view of part of a conventional prior art integrated circuit including a lateral bipolar transistor and CMOS transistors

Part of a known prior art BiCMOS integrated circuit 10 formed on a semiconductor substrate, i.e., part of a silicon wafer 12, is shown in FIG. 1. Openings through a field oxide layer 14 defining device well regions of the substrate, in which are formed a conventional PNP lateral bipolar transistor structure 16, and conventional CMOS transistors 18 and 20. The lateral bipolar transistor 16 comprises an emitter region 22, an annular collector region 24 surrounding the emitter 22, and a buried base electrode 26 with a base contact 28 at the surface. When current from the emitter 20 is launched in all directions, as shown schematically by the arrows, although the annular collector 24 surrounds the emitter 22, a significant proportion of the current may be lost to the substrate. Consequently, the lateral bipolar transistor efficiency is poor.

Figure 2:
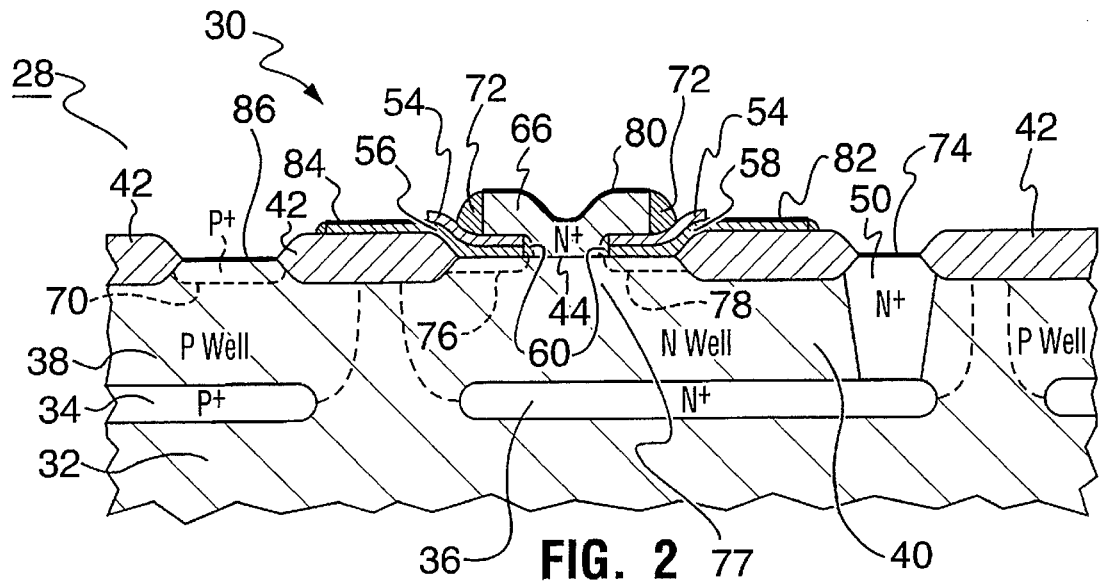
FIG. 2 shows a cross-sectional view through a self-aligned lateral bipolar transistor according to a first embodiment of the present invention.

Part of an integrated circuit 28 which comprises a lateral bipolar transistor 30 according to a first embodiment of the present invention is shown in FIG. 2. Cross-sectional views through a partially fabricated transistor at successive stages during fabrication are shown in FIGS. 3 to 9. The transistor 30 (FIG. 2) is formed on a silicon substrate 32, e.g. a conventional silicon semiconductor wafer, in which are defined heavily doped $P^+$ and $N^+$ buried layers, e.g. $P^+$ doped buried layer 34 and $N^+$ doped buried layer 36, and N and P well regions 38 and 40 respectively, incorporated in a conventional manner for BiCMOS integrated circuit manufacturing. Field isolation regions 42 define openings over active device well regions 44. A heavily doped collector region 76 and heavily doped emitter region 78 are defined in the surface region of the well region 44, with a polysilicon contact electrodes 56 and 58 formed thereto and defining a base contact opening therebetween. A polysilicon base contact 80 is formed to the surface region 44 forming the base region extending between the collector region 76 and emitter region 78. Dielectric sidewall spacers 60 isolate the emitter and collector electrodes 58 and 56 from the base contact electrode 66.

Figure 10:
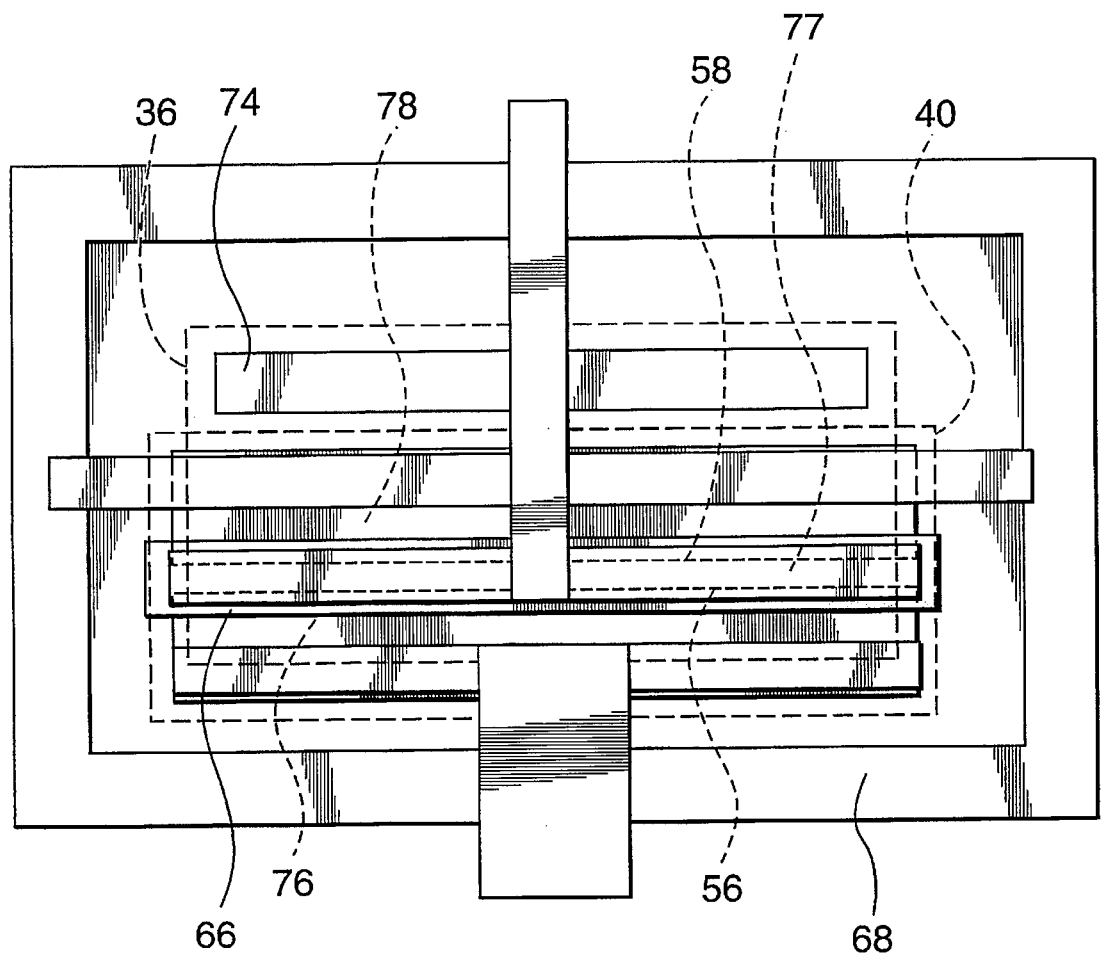
FIG. 10 shows a schematic top plan view of the layer of the lateral bipolar transistor of the first embodiment.

A schematic top plan view of the layout of the lateral bipolar transistor 30 is shown in FIG. 10, showing the emitter electrode 58 and collector electrode 56, self-aligned base contact 66 extending between the emitter and collector regions over the base region 77.

In the resulting structure, the self-aligned polysilicon second base contact 66 provided a much narrower base width than existing typical field oxide isolated lateral bipolar transistors, i.e. as typified by the example in FIG. 1. Also, the direct polysilicon base contact provides a much lower base resistance than known LPNP transistors.

The combination of reduced base resistance and base width improve the device performance, increasing $f_t$ and $f_{max}$. The polysilicon emitter contact improves emitter efficiency, thereby increasing the current gain. The polysilicon emitter and collector contacts improve the emitter efficiency and current gain, and allows for more flexible contact placement. The poly contacts also minimize the emitter and collector contact area compared to the conventional LPNP device and therefore reduces the emitter-base and emitter-collector capacitances, which results in higher device speed. In particular the structure provides high performance LPNP devices in a 0.5 µm self-aligned bipolar technology. The devices thus find particular applications in integrated circuits for advanced high speed telecommunications systems.

Figure 3:
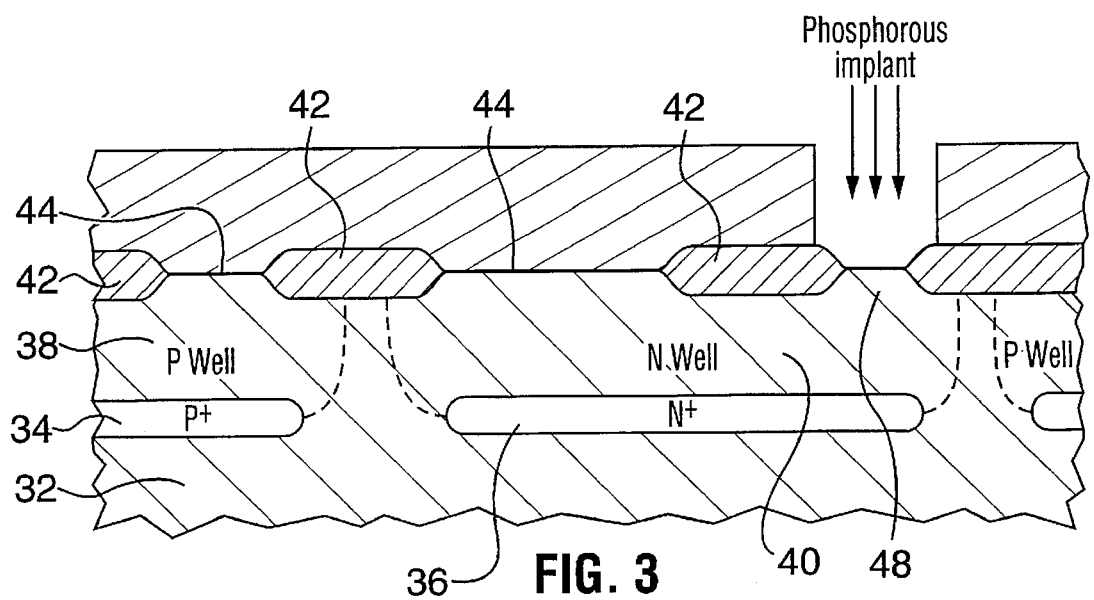
FIGS. 3 to 9 show a series of cross-sectional views through a partially fabricated lateral bipolar transistor of FIG. 2, at successive stages during fabrication of a transistor.

In a method of forming a lateral bipolar transistor according to the first embodiment, as shown schematically in FIGS. 3 to 9, a conventional semiconductor silicon substrate 32 for integrated circuit, in which are defined heavily doped buried layers of first and second conductivity types, i.e. a $P^+$ buried layer 34 and a $N^+$ buried layer 36, and overlying, relatively lightly doped well regions 38 and 40 of corresponding conductivity types. Field isolation regions, i.e. silicon dioxide 42, are then provided by a conventional poly-buffered LOCOS (PBL) process to define openings over active device well regions 44 (FIG. 3).

Figure 4:
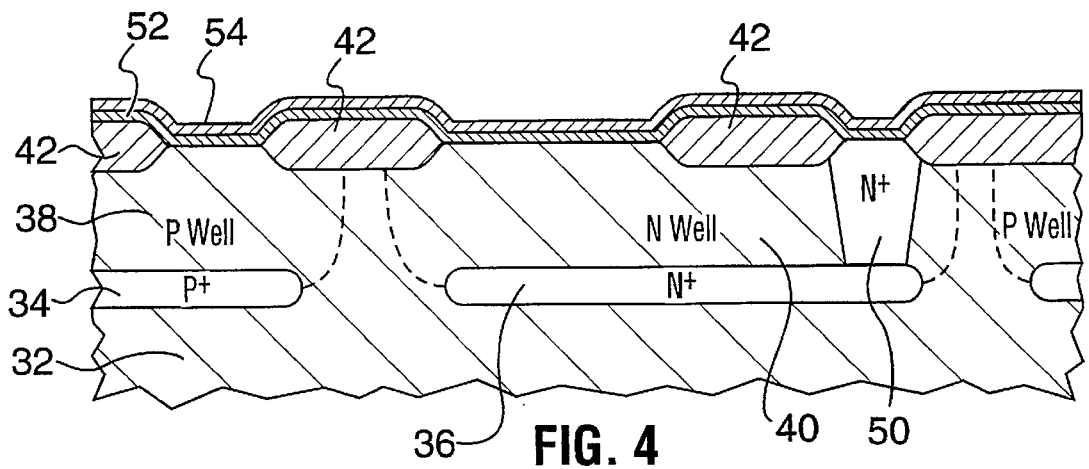
Figure 5:
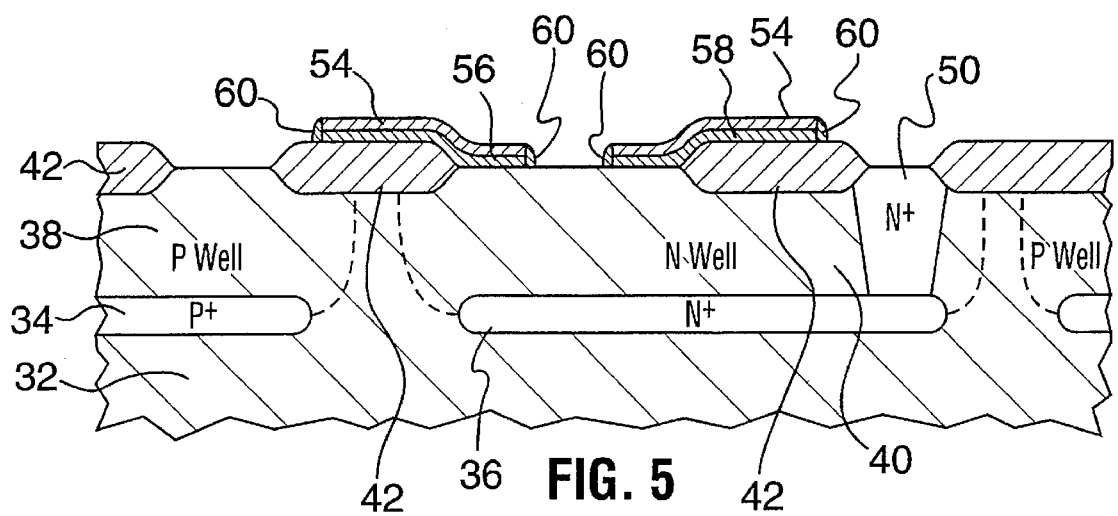

After masking with photoresist 46, a phosphorus implant is then performed into region 48 to define a base contract region 50 (see FIG. 4) of a polysilicon lateral PNP (PLPNP) bipolar transistor. After photoresist stripping and cleaning, an anneal, e.g. at 950° C. for 50 minutes, is performed to drive the implant deep enough to contact the $N^+$ buried layer 36 thereby forming a buried base contact region 50 (FIG. 4). A wet clean and brief HF oxide etch step then prepares the surface for deposition thereon of a layer of polysilicon 52.

For example, a layer of undoped polysilicon, 1500 Å thick, is deposited by a conventional known method. The polysilicon layer is then doped by ion implantation with a heavy dose of Boron ions, e.g. $4\times10^{15}$ $cm^{-2}$ at 10 keV. Alternatively a layer of in-situ doped polysilicon may be provided by a conventional method. A layer of dielectric, i.e. an oxide layer 54 is then deposited thereon, for example a layer of 2200 Å CVD silicon dioxide (FIG. 4).

The polysilicon and oxide layers are then patterned together to define emitter 56 and collector electrodes 58, as shown in FIG. 4, using conventional masking and anisotropic etch processes, to leave the polysilicon regions 56 and 58 which define the emitter and collector electrodes, covered by the layer of oxide 54. A base contact opening 62 on an intervening base region is thus defined between the collector electrode 56 and emitter electrode 58.

Dielectric sidewall spacers 60 are then provided on exposed sidewalls of the parts of the polysilicon layer 56 and 58 defining the emitter and collector electrodes. Sidewall spacers 60 are formed e.g. by deposition of 3000 Å oxide followed by anisotropic etchback.

Figure 6:
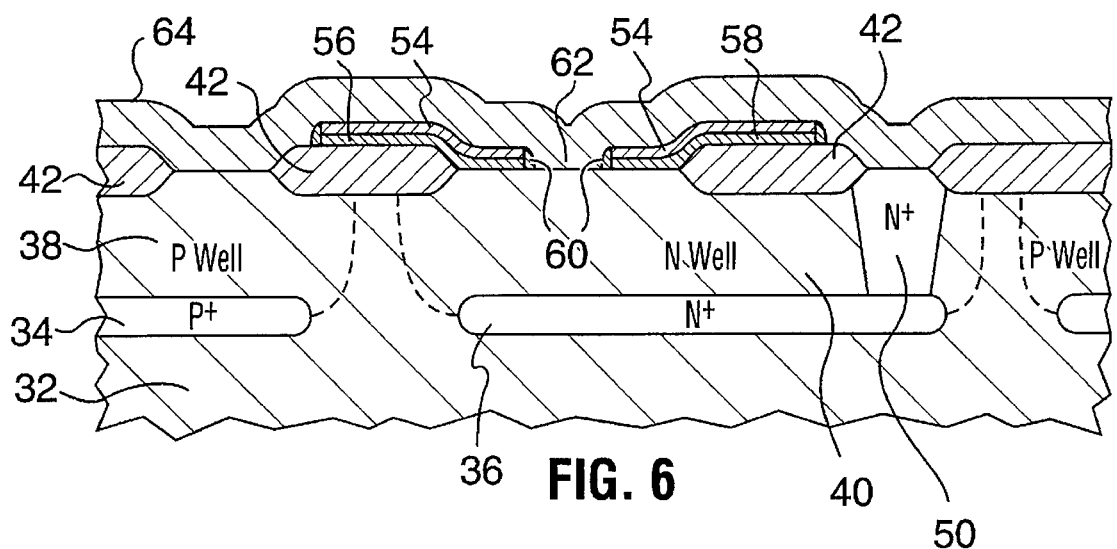
Figure 7:
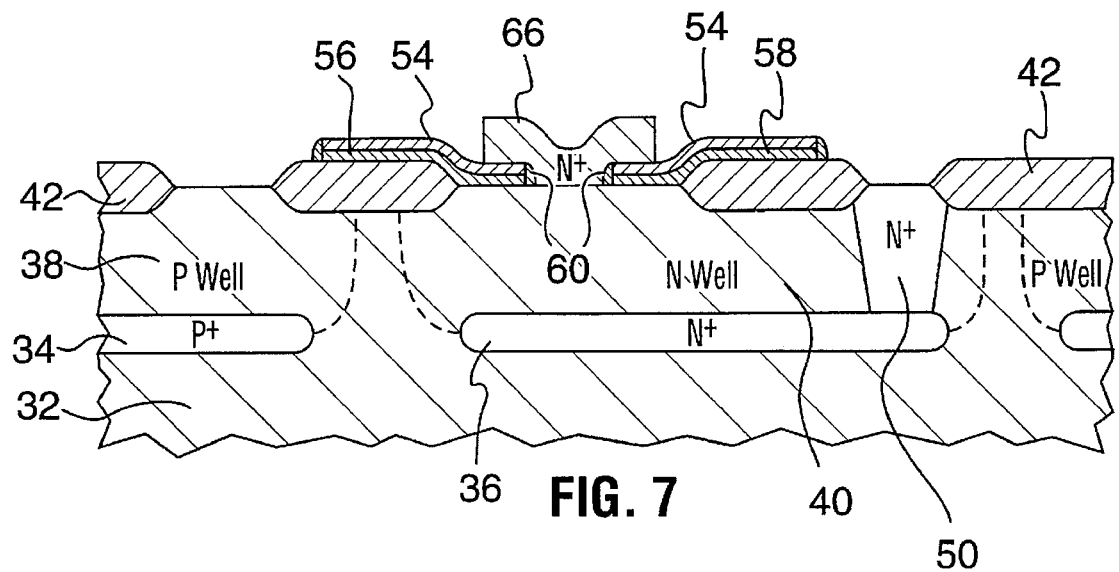

Another layer of polysilicon 64 is then deposited overall, filling the base contact opening 62. A heavy dose of an N type dopant is then implanted into the polysilicon 64 e.g. $As^+$ $1.5\times10^{16}$ $cm^{-2}$ at 75 keV, to form a conductive base contact layer (FIG. 6). The polysilicon layer 64 is patterned to defined the base contact structure 66 as shown in FIG. 7, which is isolated from the emitter and collector contact electrodes 56 and 58 by oxide layer 54 and dielectric sidewall spacers 60.

Figure 8:
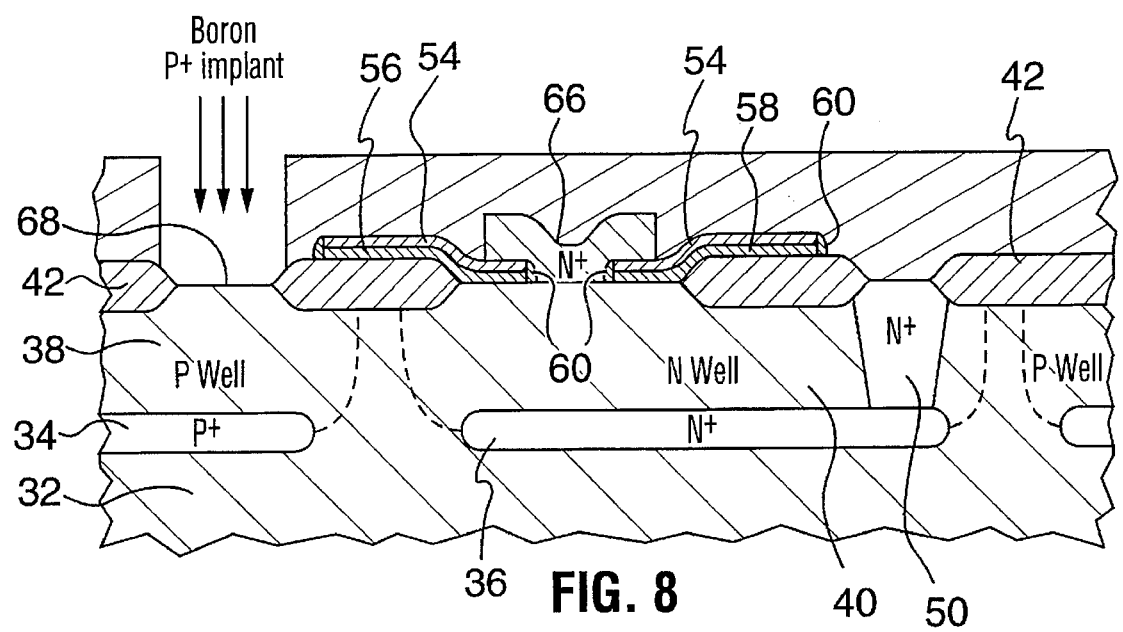

A substrate contact is then formed in region 68 by photoresist masking and implantation of boron, as shown in FIG. 8, into an adjacent part of the P well region 70.

Dielectric sidewall spacers 72 are then formed on sidewalls of the base contact 66 in a conventional manner, as described above. High temperature, rapid thermal annealing activates all dopant implants, and drives in the $P^+$ emitter and collector regions 76 and 78 in the surface region, and drives $As^+$ through the base contact $N^+$ polysilicon 66, to form a contact with the base region 77 of the structure, as shown in FIG. 9.

Figure 9:
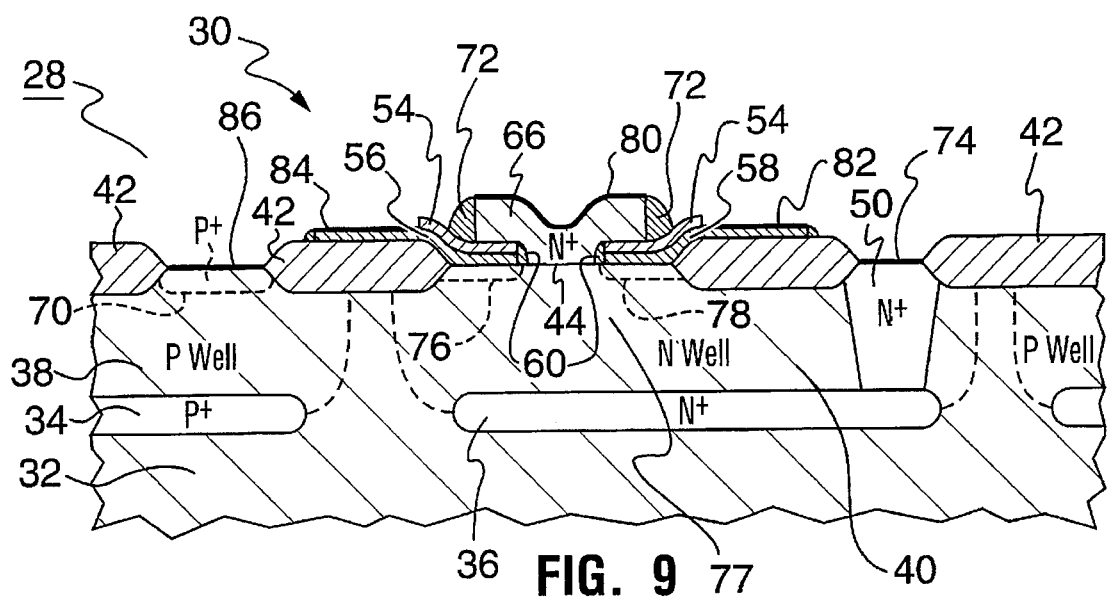

Preferably the contact regions 80, 82, 84 and 86 are salicided as shown in FIG. 9 to reduce contact resistance. Interconnect metallization (not shown) is then provided in a conventional manner to complete the structure.

The fabrication process for the LPNP transistor is relatively simple compared with a conventional double polysilicon vertical bipolar transistor process. The lateral bipolar transistor can be fabricated without adding process steps to a known bipolar CMOS process flow.

In modifications of the embodiments, variations of conventional method steps may be used. Thus, although particular embodiments of the invention have been described in detail, it should be appreciated that numerous modifications, variations and adaptations may be made without departing from the scope of the invention as defined in the claims.

What is claimed is:

1. A method of forming a lateral bipolar transistor comprising:

providing an integrated circuit substrate having a first and second heavily doped buried layers of a first and second conductivity type defined therein, and well regions of a corresponding conductivity type formed thereon;

defining field isolation regions thereon having openings defining device well regions;

forming thereon a first layer of heavily doped polysilicon of a second conductivity type;

providing a dielectric isolation layer on the first polysilicon layer;

patterning the first layer of polysilicon and overlying dielectric layer to define a base contact opening therein, and first and second portions of the polysilicon layer forming a collector contact electrode and an emitter contact electrode adjacent the base contact opening;

providing dielectric sidewall spacers on sidewalls of the polysilicon layer within the base contact opening;

providing a second heavily doped layer of polysilicon within the base contact opening thereby forming a first base contact electrode to the base region of the substrate;

forming a second base contact to the buried layer underlying the emitter and collector regions annealing the structure to diffuse dopant from the emitter and collector electrodes thereby forming heavily emitter and collector regions in the substrate surface, the well region of the opposite conductivity extending therebetween forming the base region of a lateral bipolar transistor, with first and second base contact electrodes formed by the second polysilicon layer and the underlying part of the heavily doped buried layer respectively.

2. A method according to claim 1 comprising forming another contact to the buried layer of the second conductivity type thereby forming a substrate contact.

* * * * *